(12) United States Patent
Ho et al.

(10) Patent No.: US 6,565,008 B2
(45) Date of Patent: May 20, 2003

(54) MODULE CARD AND A METHOD FOR MANUFACTURING THE SAME

(75) Inventors: Mon Nan Ho, Hsinchu Hsien (TW);
Hsiu Wen Tu, Hsinchu Hsien (TW);
Kuo Feng Feng, Hsinchu Hsien (TW);
Yung Sheng Chiu, Hsinchu Hsien (TW); Joe Liu, Hsinchu Hsien (TW);
Nai Hua Yeh, Hsinchu Hsien (TW);
Wen Chuan Chen, Hsinchu Hsien (TW); Allis Chen, Hsinchu Hsien (TW)

(73) Assignee: Kingpak Technology Inc., Hsinchu Hsien (TW)

( * ) Notice: Subject to any disclaimer, the term of this patent is extended or adjusted under 35 U.S.C. 154(b) by 0 days.

(21) Appl. No.: 10/018,072

(22) PCT Filed: Dec. 4, 2000

(86) PCT No.: PCT/CN00/00529
§ 371 (c)(1),
(2), (4) Date: Dec. 4, 2001

(87) PCT Pub. No.: WO01/80301
PCT Pub. Date: Oct. 25, 2001

(65) Prior Publication Data
US 2003/0071129 A1 Apr. 17, 2003

(30) Foreign Application Priority Data
Apr. 4, 2000 (CN) .......................................... 00106523 A

(51) Int. Cl.$^7$ ................................................ G06K 19/06
(52) U.S. Cl. ...................................... 235/492; 361/799
(58) Field of Search .......................... 235/492; 361/799

(56) References Cited

U.S. PATENT DOCUMENTS 6,297,966 B1 * 10/2001 Lee et al. .................... 361/799

\* cited by examiner

Primary Examiner—Harold I. Pitts
(74) Attorney, Agent, or Firm—Pro-Techtor International Services

(57) ABSTRACT

A manufacturing method of a module card comprises steps of: providing a base board having a golden finger; mounting a chip on the base board for electrically connecting to the golden finger; and forming a packing layer on the chip for forming the module card. A module card comprises: a base board; a chip mounting on a surface of the base board; a golden finger on the board and electrically connecting to the chip; and a packing layer forming on the chip for covering the chip.

10 Claims, 3 Drawing Sheets

US 6,565,008 B2

MODULE CARD AND A METHOD FOR MANUFACTURING THE SAME

FIELD OF THE INVENTION

The present invention is related to a module card and it's manufacturing method, and specially to the module card of a printed circuit board (PCB) having golden fingers and the manufacturing method.

BACKGROUND OF THE INVENTION

The utility of a module card is very general. It may be used as an electronic part or a peripheral device in the computer, communication and consumer electronic product domains.

The prior method for manufacturing the module card always packs chips as integrated circuits (ICs), then mounts them onto a printed circuit board (PCB) as a module card by way of surface mount technique (SMT). The chip may be a memory element, such as an active element of the flash memory. There are golden fingers on the module card for inserting into a slot of a computer main-board. Certainly, some inactive elements such as resistance, capacitor and inductor are mounted on the module card.

Please refer to FIG. 1 showing the cleaved view of a prior module card. The Golden fingers 15 is used to insert into a slot of a computer main-board. There are active elements are inactive elements mounted on the module card. The active elements usually are packed as an integrated circuit 11 (IC). Each IC 11 includes a chip 12. The chip 12 may be a memory chip, for example a flash memory chip. The pins 13 of ICs 11 are mounted onto the printed circuit board 14 (PCB) as the module card SMT. There are solder points 17 on the PCB 14 so that the pins of ICs 11 may be mounted onto. The prior arts has the following disadvantages:

1. A chip must be packed as an IC before the IC is mounted onto the PCB, so more steps are needed and the cost in manufacturing and packing will be increased.
2. A module card always includes many ICs so that the ICs must be mounted on the PCB one by one during manufacturing the module card.
3. The cost of SMT is expensive. Special manufacture devices such as a SMT machine and a solder furnace are needed.
4. The module card is manufactured separately so that the throughput is low.

SUMMARY OF THE INVENTION

An object of the present invention is to provide an module card using the chip-on-board technique to mount chips on a PCB firstly before packing the chips and the PCB for reducing the step of SMT.

Another object of the present invention is to provide the manufacturing method of the module card to reduce the cost.

Another object of the present invention is to provide the manufacturing method of the module card to increase the throughput.

According to the present invention, a manufacturing method of a module card comprises steps of: providing a base board having a golden finger; mounting a chip on the base board for electrically connecting to the golden finger; and forming a packing layer on the chip for forming the module card.

In accordance with one aspect of the present invention, the base board includes a first surface and a second surface for mounting a plurality of the chips on the first surface and the second surface.

In accordance with one aspect of the present invention, the base board includes a plurality of package areas for packing a plurality of the module cards once.

In accordance with one aspect of the present invention, the packing layer includes a material of epoxy mold compound.

In accordance with one aspect of the present invention, the base board is a circuit board, and the circuit board is a printed circuit board.

According to the present invention, a module card comprises: a base board; a chip mounting on a surface of the base board; a golden finger on the board and electrically connecting to the chip; and a packing layer forming on the chip for covering the chip.

In accordance with one aspect of the present invention, the packing layer includes a material of epoxy mold compound.

In accordance with one aspect of the present invention, the surface of the base board includes a first surface and a second surface for packing a plurality of the chips.

In accordance with one aspect of the present invention, the module card is double sided.

In accordance with one aspect of the present invention, the base board is a circuit board, and the circuit board is a printed circuit board.

The present invention may best be understood through the following description with reference to the accompanying drawings, in which:

DETAILED DESCRIPTION OF THE PREFERRED EMBODIMENT

Figure 2:
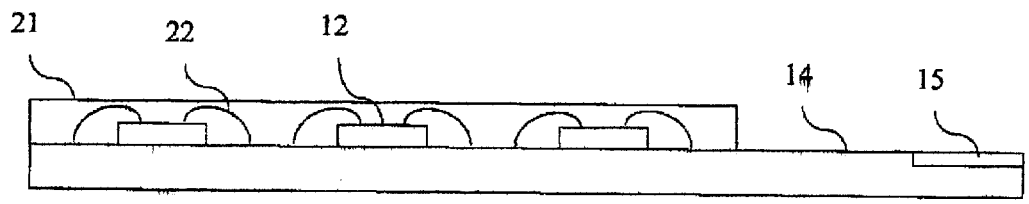
FIG. 2 is a module card cleaved diagram according to the present invention.

FIG. 2 shows the cleaved structure of a module card according the present invention. It is different to the prior arts that chips 12 are directly mounted onto the PCB 14 by way of chip-on-board technique. Each chip has bond pads for wire bonding so that the metal wires 12 can be connected onto the PCB 14 before forming the packing layer (on packing area 21) on the chips. The packing layer includes the material of epoxy mold compound. After packing layer is formed, the module card is completed. The steps is simplified. The SMT step is reduced so the speed of manufacturing the module card will be improved, and simultaneously the cost will be reduced.

Figure 3:
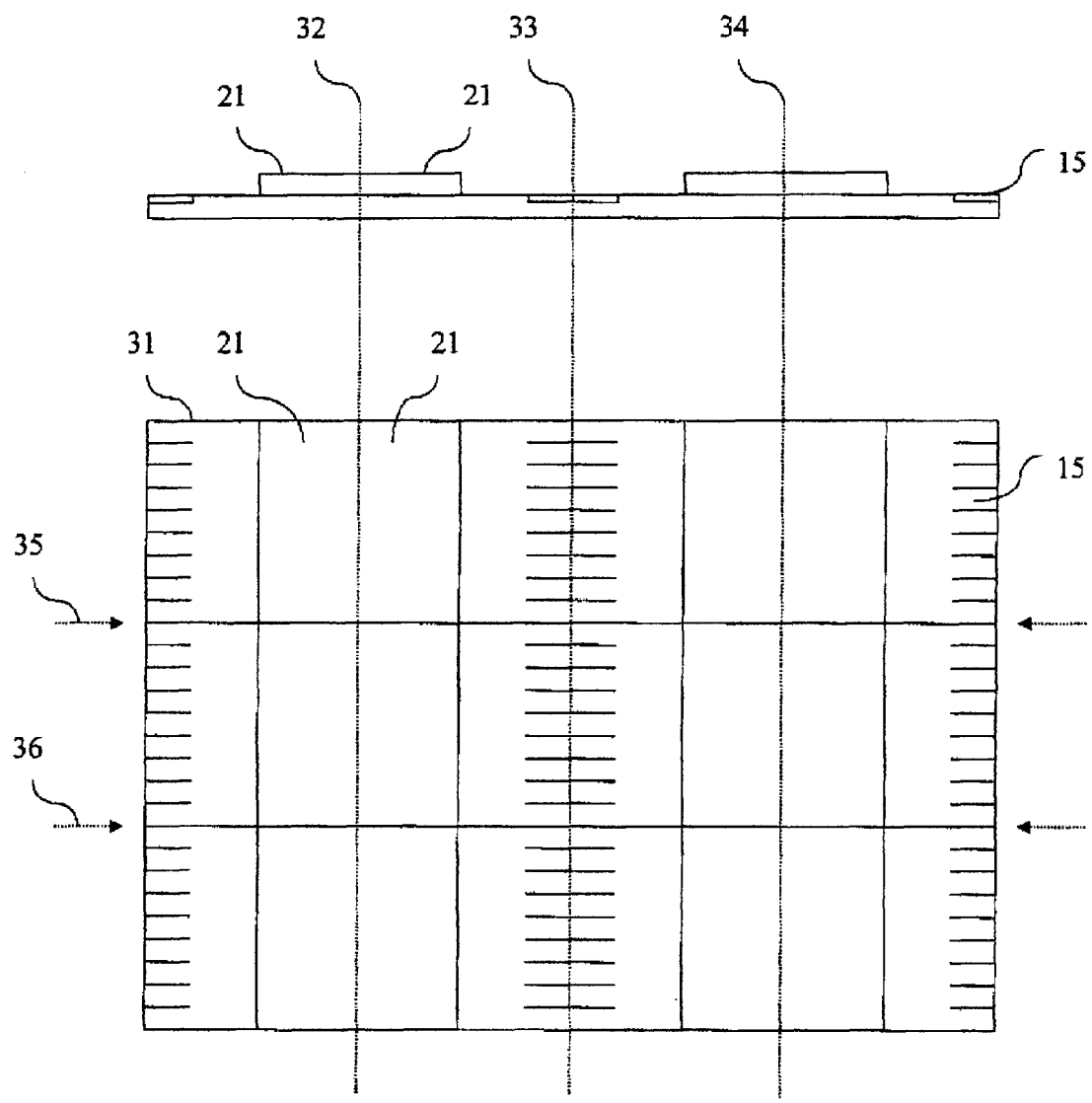
FIG. 3 is the method for manufacturing a module card according to the present invention.

FIG. 3 shows the steps of manufacturing a batch of module cards. There are twelve packing areas. Each packing area can be packed a module card. The upper part of the figure is a side view and the lower part is a top view. The packing area are symmetrical each other. The six packing areas 21 on left side are connected together, and the six packing areas 21 on right side are also connected together, so the twelve packing areas 12 can be manufactured simultaneously. When the packing layer is covered on the packing areas 12 completely, cutting from the symmetrical lines 32, 34, 35, 36, the twelve module cards will be formed.

Figure 4:
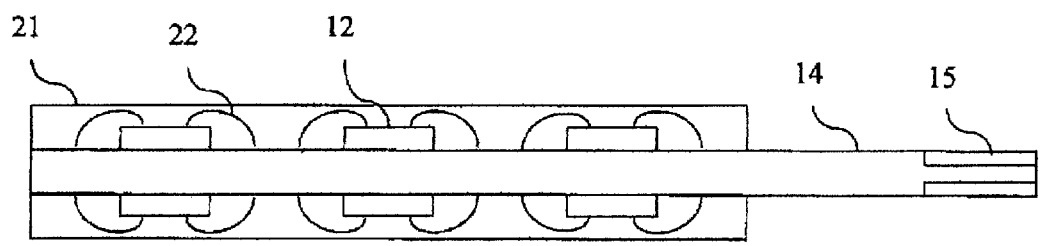
FIG. 4 is a double sided module card cleaved diagram according to the present invention.

FIG. 4 shows the double sided module card cleaved diagram according to the present invention. It is different to FIG. 2 that the chips 12 are mounted onto the first surface 41 and the second surface 42 of the PCB 14. This will improve the utility of the PCB 14, so as to improve the packing density.

Figure 5:
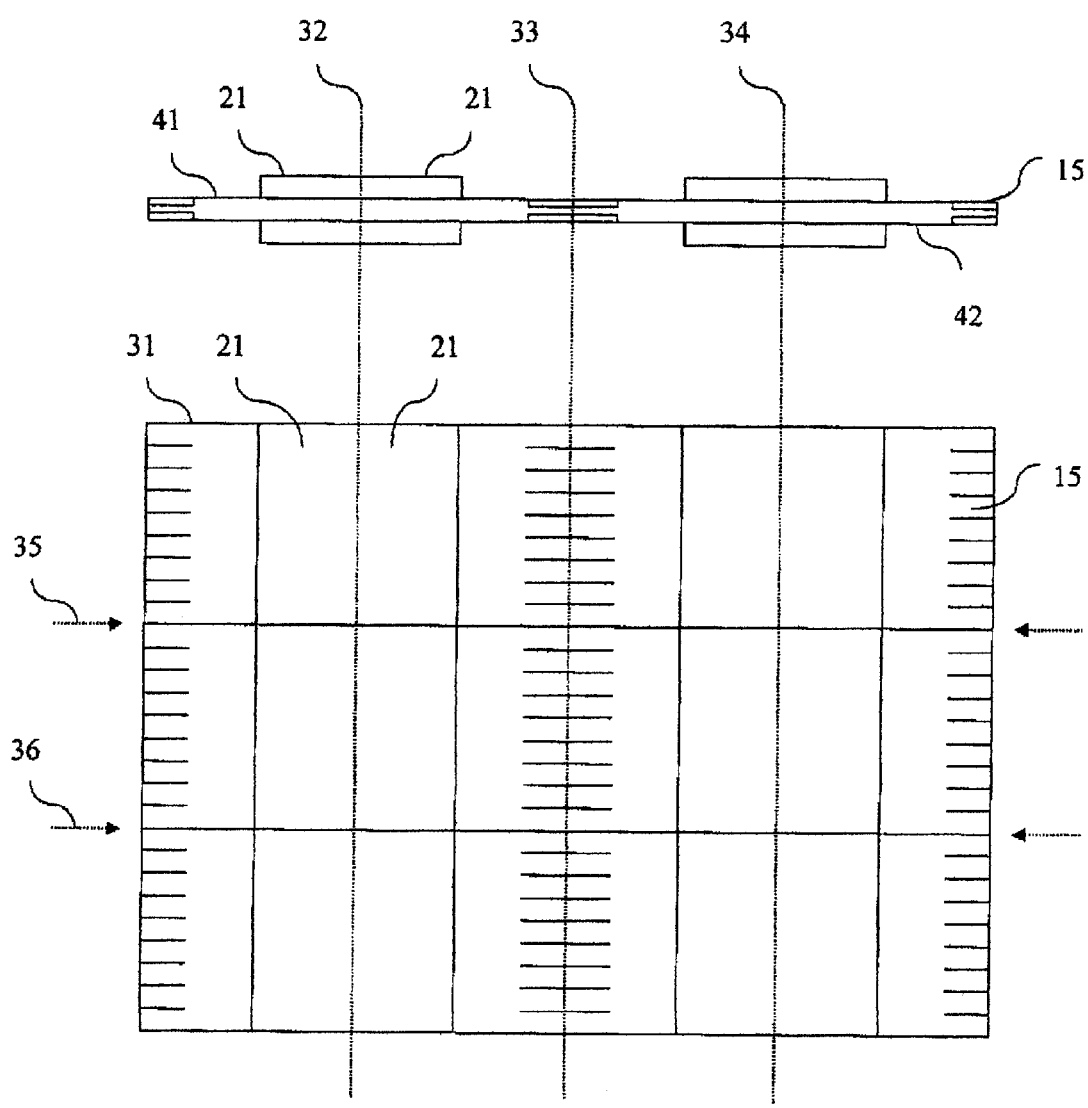
FIG. 5 is the method for manufacturing a double sided module card according to the present invention.

FIG. 5 shows the method for manufacturing a double sided module card according to the present invention. The same as FIG. 3, there are twelve packing areas 12 on the base board. After the packing layer are formed on the packing areas 12 completely, the twelve module cards may be cutted down from the symmetrical lines 32, 34, 35, 36.

According to the present invention, the manufacturing method of a module card comprise steps of: providing a base board having a golden finger; mounting a chip on the base board for electrically connecting to the golden finger; and forming a packing layer on the chip for forming the module card. The following steps are mentioned in detail:

(1) Firstly, a PCB 31 is provided. The PCB 31 have two packing areas 21 at least, and the packing areas 21 are symmetrical each other. Each module card has the golden fingers 15.

(2) Secondly, the chips 12 (referring to FIG. 2) are mounted onto the packing areas 21.

(3) The packing layer is formed on the packing areas 21 and the chips 12. At least, two module cards can be produced after cutting the symmetrical lines.

The symmetrical lines may be between two packing areas 21 or two golden fingers 15 area. The packing layer includes the material of epoxy mold compound. For increasing the packing density, the double-sided process as FIG. 4 and FIG. 5 is recommended.

According to the present invention, the following advantages are issued:

1. The chips are mounted directly onto the PCB of the module card, so the SMT step is reduced, and the cost is easy to down.

2. The way of batch manufacture improves the throughput specially on the process of the packing layer and golden fingers.

3. The double-sided packing technique improves the packing density and the utility of the PCB.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A manufacturing method of a module card comprising steps of:

providing a base board having a golden finger;

mounting a chip on said base board for electrically connecting to said golden finger; and forming a packing layer on said chip for forming said module card.

2. A manufacturing method according to claim 1 wherein said base board includes a first surface and a second surface for mounting a plurality of said chips on said first surface and said second surface.

3. A manufacturing method according to claim 1 wherein said base board includes a plurality of package areas for packing a plurality of said module cards once.

4. A manufacturing method according to claim 1 wherein said packing layer includes a material of epoxy mold compound.

5. A manufacturing method according to claim 1 wherein said base board is a circuit board, and said circuit board is a printed circuit board.

6. A module card comprising:

a base board;

a chip mounting on a surface of said base board;

a golden finger on said board and electrically connecting to said chip; and a packing layer forming on said chip for covering said chip.

7. A module card according to claim 6 wherein said packing layer includes a material of epoxy mold compound.

8. A module card according to claim 6 wherein said surface of said base board includes a first surface and a second surface for packing a plurality of said chips.

9. A module card according to claim 6 wherein said module card is double sided.

10. A module card according to claim 6 wherein said base board is a circuit board, and said circuit board is a printed circuit board.

* * * * *

(12) INTER PARTES REEXAMINATION CERTIFICATE (636th)
United States Patent
Ho et al.

(10) Number: US 6,565,008 C1
(45) Certificate Issued: Jul. 12, 2013

(54) MODULE CARD AND A METHOD FOR MANUFACTURING THE SAME

(76) Inventors: Mon Nan Ho, Hsinchu Hsien (TW); Hsiu Wen Tu, Hsinchu Hsien (TW); Kuo Feng Feng, Hsinchu Hsien (TW); Yung Sheng Chiu, Hsinchu Hsien (TW); Joe Liu, Hsinchu Hsien (TW); Nai Hua Yeh, Hsinchu Hsien (TW); Wen Chuan Chen, Hsinchu Hsien (TW); Allis Chen, Hsinchu Hsien (TW)

Reexamination Request:
No. 95/000,099, Jun. 13, 2005

Reexamination Certificate for:
Patent No.: 6,565,008
Issued: May 20, 2003
Appl. No.: 10/018,072
Filed: Dec. 4, 2001

(21) Appl. No.: 95/000,099

(22) PCT Filed: Dec. 4, 2000

(86) PCT No.: PCT/CN00/00529
§ 371 (c)(1), (2), (4) Date: Dec. 4, 2001

(87) PCT Pub. No.: WO01/80301
PCT Pub. Date: Oct. 25, 2001

(30) Foreign Application Priority Data

Apr. 4, 2000 (CN) .................................. 00106523

(51) Int. Cl.
*B42D 15/10* (2006.01)
*H01L 21/56* (2006.01)
*H01L 23/498* (2006.01)
*H01L 23/48* (2006.01)

(52) U.S. Cl.
USPC ................... 235/492; 257/E23.064; 361/799

(58) Field of Classification Search
None
See application file for complete search history.

(56) References Cited

To view the complete listing of prior art documents cited during the proceeding for Reexamination Control Number 95/000,099, please refer to the USPTO's public Patent Application Information Retrieval (PAIR) system under the Display References tab.

*Primary Examiner* — Erik Kielin

(57) ABSTRACT

A manufacturing method of a module card comprises steps of: providing a base board having a golden finger; mounting a chip on the base board for electrically connecting to the golden finger; and forming a packing layer on the chip for forming the module card. A module card comprises: a base board; a chip mounting on a surface of the base board; a golden finger on the board and electrically connecting to the chip; and a packing layer forming on the chip for covering the chip.

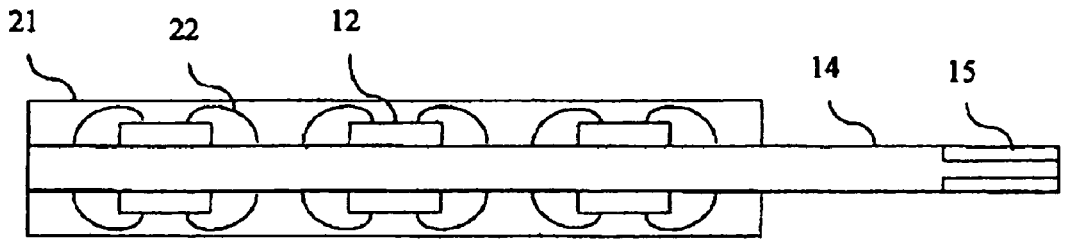

US 6,565,008 C1

INTER PARTES REEXAMINATION CERTIFICATE ISSUED UNDER 35 U.S.C. 316

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 1, lines 17-25:

The prior method for manufacturing [the] *a* module card always packs chips as integrated circuits (ICs), then mounts them onto a printed circuit board (PCB) as a module card by way of surface mount technique (SMT). The chip may be a memory element, such as an active element of [the] *a* flash memory. There are golden fingers on the module card for inserting into a slot of a computer main-board. Certainly, some inactive elements such as [resistance, capacitor and inductor] *resistors, capacitors and inductors* are mounted on the module card.

Figure 1:
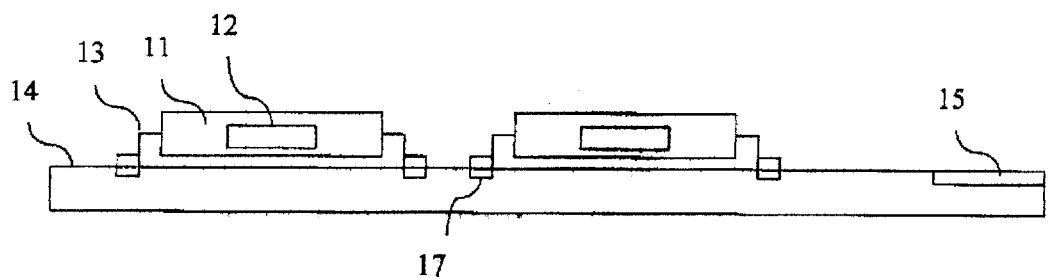
FIG. 1 is a module card cleaved diagram according to the prior arts.

Column 1, lines 26-49:

Please refer to FIG. 1, showing [the] *a* cleaved view of a prior module card. [The] Golden fingers 15 [is used to insert] *are for inserting* into a slot of a computer main-board. There are active elements [are] *and* inactive elements mounted on the module card. The active elements usually are packed as an integrated circuit 11 (IC). Each IC 11 includes a chip 12. The chip 12 may be a memory chip, for example a flash memory chip. The pins 13 of ICs 11 are mounted onto the printed circuit board 14 (PCB) as the module card *using* SMT. There are solder points 17 on the PCB 14 so that the pins of ICs 11 may be mounted [onto] *thereto*. The prior [arts] *art* has the following disadvantages:
1. A chip must be packed as an IC before the IC is mounted onto the PCB, so more steps are needed and the cost [in] *of* manufacturing and packing will be increased.
2. A module card always includes many ICs so that the ICs must be mounted on the PCB one by one during [manufacturing] *manufacture of* the module card.
3. The cost of SMT is expensive. Special [manufacture] *manufacturing* devices such as [a] *an* SMT machine and a solder furnace are needed.
4. The module card is manufactured separately, so [that the] throughput is low.

Column 1, lines 52-55:

An object of the present invention is to provide [an] *a* module card using the chip-on-board technique to mount chips on a PCB firstly, before packing the chips and the PCB, for reducing the step of SMT.

Column 1, lines 56-57:

Another object of the present invention is to provide [the manufacturing] *a* method of *manufacturing* the module card to reduce the cost.

Column 1, lines 58-60:

Another object of the present invention is to provide [the manufacturing] *a* method of *manufacturing* the module card to increase [the] throughput.

Column 1, lines 61-67:

According to the present invention, a [manufacturing] method of *manufacturing* a module card comprises steps of: providing a base board having [a] golden [finger] *fingers*; mounting a chip on the base board for electrically connecting to the golden [finger] *fingers*; and forming a packing layer on the chip for forming the module card.

Column 2, lines 1-4:

In accordance with one aspect of the present invention, the base board includes a first surface and a second surface for mounting a plurality of [the] chips on the first surface and the second surface.

Column 2, lines 5-7:

In accordance with one aspect of the present invention, the base board includes a plurality of [package] *packing* areas for packing a plurality of the module cards once.

Column 2, lines 15-19:

According to the present invention, a module card comprises: a base board; a chip [mounting] *mounted* on a surface of the base board; [a] golden [finger] *fingers* on the *base* board and electrically [connecting] *connected* to the chip; and a packing layer [forming] *formed* on the chip for covering the chip.

Column 2, lines 23-25:

In accordance with one aspect of the present invention, the [surface of the] base board includes a first surface and a second surface for packing a plurality of [the] chips.

Column 2, lines 37-38:

FIG. 1 [is] *shows* a *cleaved* module card [cleaved diagram] according to the prior [arts] *art*;

Column 2, lines 39-40:

FIG. 2 [is] *shows* a *cleaved* module card [cleaved diagram] according to the present invention;

Column 2, lines 41-42:

FIG. 3 [is the] *shows a* method for manufacturing a module card according to the present invention;

Column 2, lines 43-44:

FIG. 4 [is] *shows* a *cleaved*, double sided module card [cleaved diagram] according to the present invention; and Column 2, lines 45-46:

FIG. 5 [is the] *shows a* method for manufacturing a double sided module card according to the present invention.

Column 2, lines 51-62:

FIG. 2 shows the cleaved structure of a module card according to the present invention. It is different [to] *than* the prior [arts] *art in* that chips 12 are directly mounted onto the PCB 14 by way of *a* chip-on-board technique. Each chip has bond pads for wire bonding so that the metal wires [12] *22* can be connected onto the PCB 14 before forming the packing layer (on packing area 21) on the chips. The packing layer includes the material of epoxy mold compound. After *the* packing layer is formed, the module card is completed. The steps [is] *are* simplified. The SMT step is reduced so the speed of manufacturing the module card will be improved, and simultaneously the cost will be reduced.

Column 2, line 63-column 3, line 6:

FIG. 3 shows the steps of manufacturing a batch of module cards. There are twelve packing areas. Each packing area can be packed *as* a module card. The upper part of the figure is a side view and the lower part is a top view. The packing [area] *areas* are symmetrical *to* each other. The six packing areas 21 on *the* left side are connected together, and the six packing areas 21 on *the* right side are also connected together, so the twelve packing areas [12] *21* can be manufactured simultaneously. When the packing layer is [covered] *formed* on the packing areas [12] *21* completely, cutting [from] *along* the symmetrical lines 32, 34, 35, 36, [the] *forms* twelve module cards [will be formed].

Column 3, lines 7-12:

FIG. 4 shows [the] *a cleaved,* double sided module card [cleaved diagram] according to the present invention. It is different [to] *from* FIG. 2 *in* that the chips 12 are mounted onto the first surface 41 and the second surface 42 of the PCB 14. This will improve the utility of the PCB 14, so as to improve the packing density.

Column 3, lines 13-18:

FIG. 5 shows the method for manufacturing a double sided module card according to the present invention. [The same as] *As in* FIG. 3, there are twelve packing areas [12] *21* on the base board. After the packing layer [are] *is* formed on the packing areas [12] *21* completely, the twelve module cards may be [cutted down] *cut* from the symmetrical lines 32, 34, 35, 36.

Column 3, lines 19-34:

According to the present invention, the [manufacturing] method of *manufacturing* a module card [comprise] *comprises* steps of: providing a base board having [a] golden [finger] *fingers*; mounting a chip on the base board for electrically connecting to the golden [finger] *fingers*; and forming a packing layer on the chip for forming the module card. The following steps are mentioned in detail:
(1) Firstly, a PCB 31 is provided. The PCB 31 [have] *has at least* two packing areas 21 [at least], and the packing areas 21 are symmetrical *to* each other. Each module card has the golden fingers 15.
(2) Secondly, the chips 12 (referring to FIG. 2) are mounted onto the packing areas 21.
(3) The packing layer is formed on the packing areas 21 and the chips 12. At least[,] two module cards can be produced after cutting *along* the symmetrical lines.

Column 3, lines 35-39:

The symmetrical lines may be between two packing areas 21 or two golden fingers 15 [area] *areas*. The packing layer includes the material of epoxy mold compound. For increasing the packing density, the double-sided process as *shown in* FIG. 4 and FIG. 5 is recommended.

Column 3, lines 40-49:

According to the present invention, the following advantages [are issued] *issue*:
1. The chips are mounted directly onto the PCB of the module card, so the SMT step is reduced, [and] *as is* the cost [is easy to down].
2. The [way of] batch [manufacture] *manufacturing* improves [the] throughput [specially]*, especially* on the [process] *processing* of the packing layer and golden fingers.
3. The double-sided packing technique improves the packing density and the utility of the PCB.

Column 4, lines 1-9:

While the invention has been described in terms of what are presently considered to be the most practical and preferred embodiments, it is to be understood that the invention need not be limited to the disclosed [embodiment] *embodiments*. On the contrary, it is intended to cover various modifications and similar arrangements included within the spirit and scope of the appended claims which are to be accorded [with] the broadest interpretation so as to encompass all such modifications and similar structures.

AS A RESULT OF REEXAMINATION, IT HAS BEEN DETERMINED THAT:

Claims 1-10 are cancelled.

\* \* \* \* \*